US 8,069,396 B2

(12) United States Patent
Chen et al.

(10) Patent No.: US 8,069,396 B2
(45) Date of Patent: Nov. 29, 2011

(54) STORAGE DEVICE FOR REFRESHING DATA PAGES OF FLASH MEMORY BASED ON ERROR CORRECTION CODE AND METHOD FOR THE SAME

(75) Inventors: Ju-peng Chen, Taipei (TW); Chih-jung Lin, Taoyuan (TW)

(73) Assignee: Genesys Logic, Inc., Shindian (TW)

( * ) Notice: Subject to any disclaimer, the term of this patent is extended or adjusted under 35 U.S.C. 154(b) by 765 days.

(21) Appl. No.: 12/197,839

(22) Filed: Aug. 25, 2008

(65) Prior Publication Data
US 2010/0011276 A1     Jan. 14, 2010

(30) Foreign Application Priority Data
Jul. 11, 2008   (TW) .............................. 97126212 A

(51) Int. Cl.
*G06F 11/00*   (2006.01)
(52) U.S. Cl. .......................................... 714/763; 714/42
(58) Field of Classification Search .................... 714/42, 714/763
See application file for complete search history.

(56) References Cited

U.S. PATENT DOCUMENTS

| 7,096,406 B2 * | 8/2006 | Kanazawa et al. ............ 714/763 |
| 7,559,004 B1 * | 7/2009 | Chang et al. .................. 714/758 |
| 7,996,727 B2 * | 8/2011 | Radke ............................. 714/42 |
| 2003/0135793 A1 * | 7/2003 | Craig et al. ..................... 714/42 |
| 2007/0245068 A1 * | 10/2007 | Yero ............................. 711/103 |
| 2009/0089485 A1 * | 4/2009 | Yeh ............................... 711/103 |
| 2009/0222627 A1 * | 9/2009 | Reid ............................. 711/135 |
| 2010/0262890 A1 * | 10/2010 | Radke ........................... 714/763 |

* cited by examiner

*Primary Examiner* — Bryce Bonzo
(74) *Attorney, Agent, or Firm* — Kirton & McConkie; Evan R. Witt

(57) ABSTRACT

A storage device for refreshing pages of a flash memory comprises a flash memory, an ECC detector and a controller. The flash memory has a plurality of pages, and each page comprises a data area for storing data and a spare area for storing error correction code (ECC) corresponding to the data. The ECC detector is used to get the number of error bits of each page. The controller coupled to the ECC detector is used for storing data and ECC in a first page to a second page when a number of used bytes of the ECC stored in a spare area of the first page exceeds a first predetermined value. A number of used bytes of the ECC stored in a spare area of the second page is less than the first predetermined value. The second page is a blank page.

12 Claims, 2 Drawing Sheets

STORAGE DEVICE FOR REFRESHING DATA PAGES OF FLASH MEMORY BASED ON ERROR CORRECTION CODE AND METHOD FOR THE SAME

BACKGROUND OF THE INVENTION

1. Field of the Invention

The present invention relates to a storage device having a flash memory and related method, and more particularly, to a storage device and related method capable of refreshing data pages of the flash memory based on error correction code.

2. Description of the Related Art

Flash Memory, a non-volatile memory, may keep the previously written stored data upon shutdown. In contrast to other storage media, e.g. hard disks, soft disks, magnetic tapes and so on, the flash memory has advantages of small volume, light weight, vibration-proof, low power consumption, and no mechanical movement delay in data access; therefore, are widely use for as storage media in consumer electronic devices, embedded systems, or portable computers.

There are two kinds of flash memory: one is an NOR flash memory and the other is an NAND flash memory. An NOR flash memory is characteristically of low driving voltage, fast access speed, high stability, and are widely applied in portable electrical devices and communication devices such as Personal Computers (PCs), mobile phones, personal digital assistances (PDAs), and set-top boxes (STBs). An NAND flash memory is specifically designed as data storage media, for example, a Secure Digital (SD) memory card, a Compact Flash (CF) card, a Memory Stick (MS) card. The NAND flash memory contains a plurality of blocks, each block having a plurality of pages and each page dividing into data area and spare area. The data area may have 2048 bytes used for storing data. The spare area may have 64 bytes used for storing error correction code (ECC) as well as other software information, such as wear-leveling or logical-to-physical block-mapping information. NAND flash memory requires ECC to ensure data integrity. ECC can be used in any device that may be susceptible to data errors.

However, the flash memory may fail to change data update-in-place, that is, prior to writing data into a non-blank page, erasing a block including the non-blank page is required. In general, erasing a block takes as much time as 10-20 times greater than writing into a page. If a size of written data is over an assigned block, the filled pages in the assigned block may have to be removed to other blocks, and then erasing the assigned block is performed.

Furthermore, flash memory blocks may fail to be accessed when in excess of one million times of erasures before the block is considered to be worn out. This is because the number of erasure times for a block is close to one million times that charge within the floating gate may be insufficient due to current leakage of realized capacitor, thereby resulting in data loss of the flash memory cell, and even a failure of access to the flash memory. In other words, if a block is erased over a limited times, that block may be unable to be accessed.

Owing to a life-cycle limitation of the flash memory, how to correctly access data before the block is worn out is an important task. A conventional way is to detect a number of written times of all pages, and then to write data into a least-used page. Nevertheless, a most-used page is not essential to be worn out in the next access time, conversely, a less-used is possibly to be worn out in the next access time. In other words, the conventional way to select a page to be written relying on the number of access time is not perfect.

SUMMARY OF THE INVENTION

It is therefore an object of the present invention to provide a storage device and related method capable of refreshing data pages of the flash memory based on error correction code, to solve existing prior problem.

In brief, the claimed invention provides a storage device for refreshing pages of a flash memory comprises a flash memory, an ECC detector and a controller. The flash memory has a plurality of pages, and each page comprises a data area for storing a data and a spare area for storing error correction code (ECC) corresponding to the data. The ECC detector is used to get the number of error bits of each page. The controller coupled to the ECC detector is used for storing data and ECC in a first page to a second page when a number of used bytes of the ECC stored in a spare area of the first page exceed a first predetermined value.

According to present invention, the storage device further comprises a buffer for storing the data and the ECC read out from the plurality of pages. The buffer is a first-in first-out buffer.

According to present invention, the controller is used for marking a third page as worn-out when a number of used bytes of the ECC stored in a spare area of the third page exceeds a second predetermined vale.

According to the present invention, a method for refreshing pages of a flash memory is provided. The flash memory has a plurality of pages, and each page comprises a data area for storing data and a spare area for storing error correction code (ECC) corresponding to the data. The method comprises the steps of counting a number of used bytes of the ECC stored in the spare area of each page, and storing data and ECC in a first page to a second page when a number of used bytes of the ECC stored in a spare area of the first page exceeds a first predetermined value. A number of used bytes of the ECC stored in a spare area of the second page are less than the first predetermined value.

The present invention will be described with reference to the accompanying drawings, which show exemplary embodiments of the present invention.

DETAILED DESCRIPTION OF THE INVENTION

Figure 1:
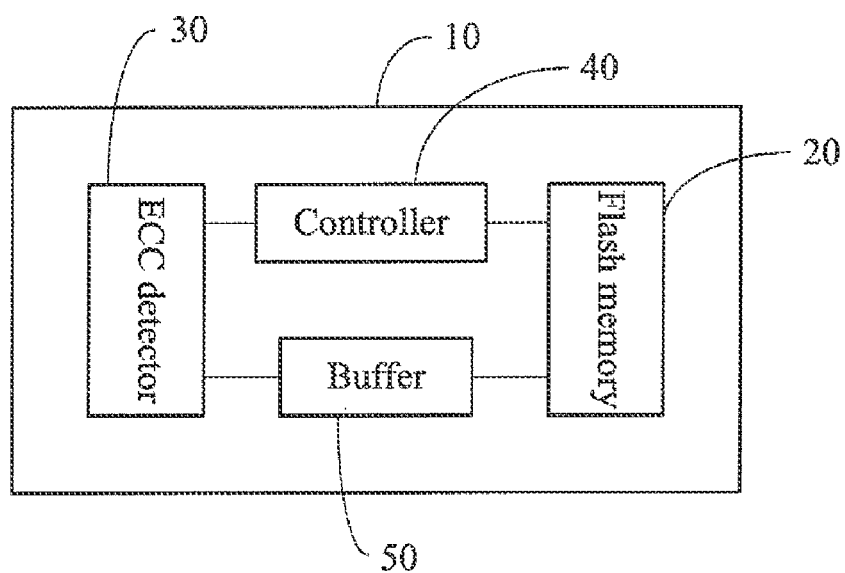
FIG. 1 illustrates a block diagram of a storage device according to a preferred embodiment of the present invention.
Figure 2:
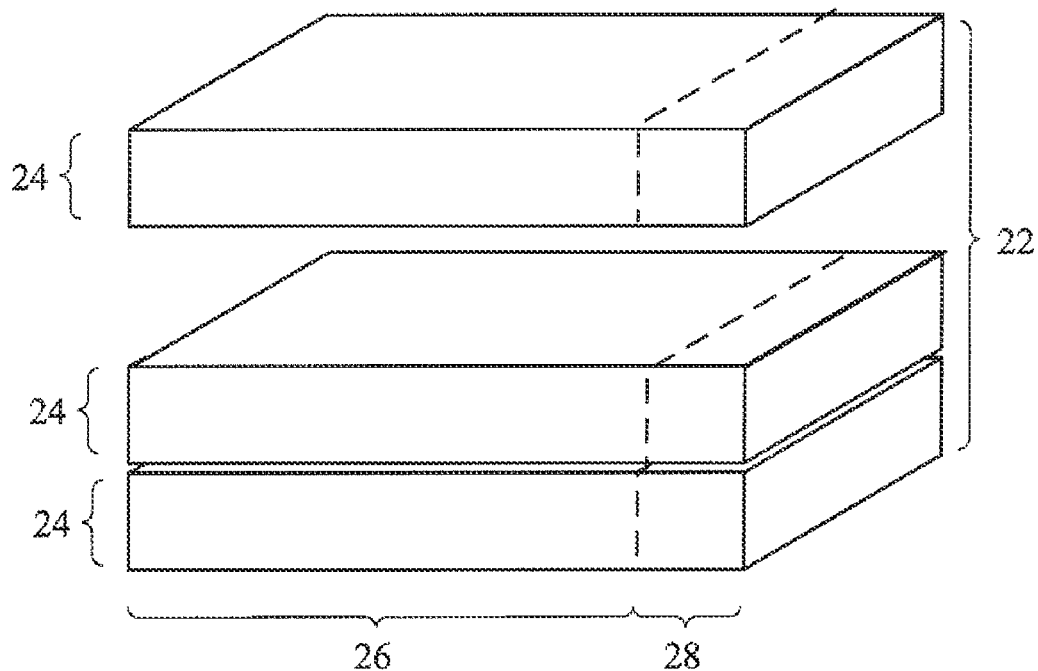
FIG. 2 shows a schematic diagram of the flash memory of the storage device.

Pleaser refer to FIG. 1 and FIG. 2. FIG. 1 Illustrates a block diagram of a storage device 10 according to a preferred embodiment of the present invention, and FIG. 2 shows a schematic diagram of the flash memory 20 of the storage device 10. The storage device 10 comprises a flash memory 20, an ECC detector 30, a controller 40, and a buffer 50. The flash memory 100 which may be a NAND flash memory is divided as a plurality of blocks 22, and each block 22 comprises a plurality of pages. Each page is divided into a data area 26 and a spare area 28. The data area 26 which may have 2048 bytes is used for storing data. The spare area 28 which may have 64 bytes is used for storing error correction code (ECC) as well as other software information, such as wear-leveling or logical-to-physical block-mapping information. The flash memory 20 requires ECC to ensure data integrity. In general, a 512-bytes data area 26 corresponds to a 16-bytes spare area. The more damaged bytes in the data area 26, the more bytes of ECC stored in the spare area 28. The buffer 50 is a first-in first-out buffer. During a programming operation, the ECC is generated based on the data stored in the data area 26. The ECC for the data area 26 is then written to the corresponding spare area 28. When the data is read out from the flash memory 30, the ECC is also read out, and the data and the ECC are sequentially stored in buffer 50. The ECC detector 30 performs a reverse operation to check that the data is correct. It is possible for the ECC algorithm to correct data errors. The number of data errors that can be corrected depends on the correction strength of the algorithm used. ECC may be generated by using simple Hamming codes, or Reed-Solomon codes or BCH codes.

Figure 3:
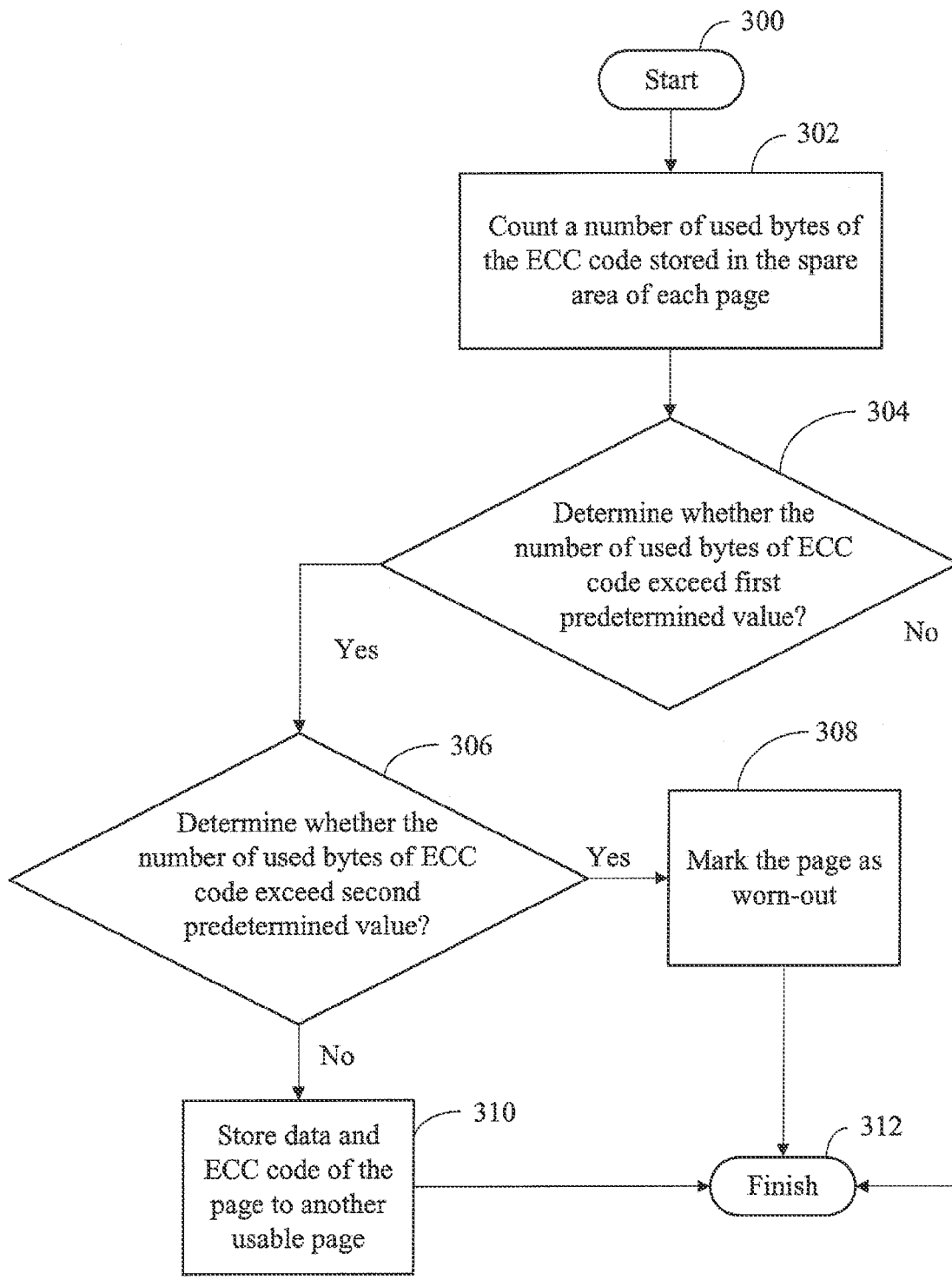
FIG. 3 is a flowchart of refreshing pages of the flash memory according to the present invention.

Please refer to FIG. 1 in conjunction to FIG. 3. FIG. 3 is a flowchart of refreshing pages of the flash memory according to the present invention. The method comprises following steps:

Step 300: Start.
Step 302: Count a number of used bytes of the ECC stored in the spare area 28 of each page.
Step 304: Determine whether the number of used bytes of the ECC stored in the spare area 28 of page 24 exceeds a first predetermined value. If it is, go to Step 304, if not, go to Step 308.
Step 306: Determine whether a number of used bytes of the ECC stored in the spare area 28 of page 24 exceeds a second predetermined value. If it is, go to Step 310, if not, go to Step 306.
Step 308: Mark the page as "worn-out".
Step 310: Store data and ECC of the page 24 to another usable page.
Step 312: Finish.

When the storage device 10 receives a read request, the controller 40 will read data in assigned pages 24 based on the read request. Afterwards, the data and ECC in the assigned pages will be read out and sequentially stored into the buffer 50. The data is then decoded as correct and desired data by the ECC detector 30 with corresponding ECC. In the meantime, the ECC detector 30 counts a number of used bytes of the ECC stored in the spare area 28 of each page 24 (Step 302). In general, a 512-bytes data, area 26 corresponds to a 16-bytes spare area 28. That the number of used bytes of the ECC stored in the spare area 28 of a first page 24 exceeds a first predetermined value indicates too many error bytes are stored in the first page 24 (Step 304), i.e. the first page has higher possibility to become a worn-out page. In this embodiment, the first predetermined value may be but not limit to 4 bytes. Then, the controller 40 can write the data and ECC in the first page into another usable second page in which a number of used bytes of the ECC stored in a spare area 28 is less than the first page. Preferably, the second page is a blank page (Step 310). If the number of used bytes of the ECC stored in the spare area 28 of a first page 24 is less than the first predetermined value, the first page 24 is normal and far from a risky of worn-out, and allows to store data and ECC.

If a number of used bytes of the ECC stored in the spare area 28 of a first page 24 exceeds a third predetermined value exceeds the second predetermined value and the first predetermined value, it indicates the third page 24 complies a benchmark of worn-out. The controller 40 will mark the third page as "worn-out", and data will not store in to the third page any more.

In contrast to prior art, the present inventive storage device refresh the pages of the flash memory based on a number of used bytes of the ECC stored in the spare area of a page. The more bytes that are used of the ECC, the more error bytes that will be in the data, as well as the higher possibility of the page is to be worn-out. Consequently, the present inventive storage device and method are more reliable to refresh page than the convention way is based on a number of access times.

While the present invention has been described in connection with what is considered the most practical and preferred embodiments, it is understood that this invention is not limited to the disclosed embodiments but is intended to cover various arrangements made without departing from the scope of the broadest interpretation of the append claims.

What is claimed is:

1. A storage device for refreshing pages of a flash memory comprising:
   a flash memory having a plurality of pages, each page comprising a data area for storing data and a spare area for storing error correction code (ECC) corresponding to the data;
   an ECC detector, for counting a number of used bytes of the ECC stored in the spare area of each page; and
   a controller coupled to the ECC detector, for storing data and ECC in a first page to a second page when a number of used bytes of the ECC stored in a spare area of the first page exceeds a first predetermined value, wherein a number of used bytes of the ECC stored in a spare area of the second page is less than the first predetermined value.

2. The storage device as claimed in claim 1, wherein the flash memory is an NAND flash memory.

3. The storage device as claimed in claim 1, further comprising a buffer for storing the data and the ECC read out from the plurality of pages.

4. The storage device as claimed in claim 3, wherein the buffer is a first-in first-out buffer.

5. The storage device as claimed in claim 1, wherein the controller is used for marking a third page as worn-out when a number of used bytes of the ECC stored in a spare area of the third page exceeds a second predetermined vale.

6. The storage device as claimed in claim 5, wherein the first predetermined value is less than the second predetermined value.

7. The storage device as claimed in claim 1, wherein the second page is a blank page.

8. A method for refreshing pages of a flash memory, the flash memory having a plurality of pages, each page comprising a data area for storing data and a spare area for storing error correction code (ECC) corresponding to the data, the method comprising:
   counting a number of used bytes of the ECC stored in the spare area of each page; and
   storing data and ECC in a first page to a second page when a number of used bytes of the ECC stored in a spare area of the first page exceeds a first predetermined value, wherein a number of used bytes of the ECC stored in a spare area of the second page is less than the first predetermined value.

9. The method as claimed in claim 8, wherein the flash memory is an NAND flash memory.

10. The method as claimed in claim 8, further comprising:
    marking a third page as worn-out when a number of used bytes of the ECC stored in a spare area of the third page exceeds a second predetermined vale.

11. The method as claimed in claim 10, wherein the first predetermined value is less than the second predetermined value.

12. The method as claimed in claim 8, wherein the second page is a blank page.

* * * * *